(12) United States Patent
Ward

(10) Patent No.: US 6,259,246 B1
(45) Date of Patent: Jul. 10, 2001

(54) LOAD SENSING APPARATUS AND METHOD

(75) Inventor: Charles E. Ward, Sarasota, FL (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/304,742

(22) Filed: May 4, 1999

(51) Int. Cl.$^7$ ................................................. G01R 13/00
(52) U.S. Cl. ......................... 324/127; 324/73.1; 324/133
(58) Field of Search .................. 324/127, 73.1, 324/115, 133, 149, 118, 120

(56) References Cited

U.S. PATENT DOCUMENTS

| | | |
|---|---|---|
| 3,602,801 | 8/1971 | Williamson . |
| 3,714,540 * | 1/1973 | Galloway ................................. 321/2 |
| 3,793,557 | 2/1974 | Cramer . |
| 3,810,012 | 5/1974 | Harris . |
| 3,855,101 | 12/1974 | Wilson . |
| 3,896,366 | 7/1975 | Onogi . |
| 4,292,595 | 9/1981 | Smith . |
| 4,412,184 | 10/1983 | Embree . |
| 4,506,230 | 3/1985 | Ashley-Rollman . |
| 4,527,118 * | 7/1985 | Kosar ..................................... 324/133 |
| 4,541,040 | 9/1985 | Allfather . |
| 4,667,144 | 5/1987 | Jones et al. . |
| 4,769,594 * | 9/1988 | Darius et al. ......................... 324/662 |
| 4,916,329 * | 4/1990 | Dang et al. ............................. 307/36 |
| 5,187,446 | 2/1993 | Daly . |
| 5,392,784 | 2/1995 | Gundaitis . |

* cited by examiner

Primary Examiner—Safet Metjahic
Assistant Examiner—T. R. Sundaram
(74) Attorney, Agent, or Firm—Boyle Fredrickson Newholm Stein & Gratz S.C.

(57) ABSTRACT

A load sensing circuit detects an input load signal across a transformer based on changes in electric current conducted through a primary winding of the transformer. A triangle wave signal is provided to the primary winding of the transformer to induce a corresponding signal at a secondary winding of the transformer. The signal at the secondary winding varies as a function of the input load signal to effect corresponding changes in the electric current conducted through the primary winding. An output circuit provides an indication of the value of the load signal based on the current conducted through the primary winding.

16 Claims, 3 Drawing Sheets

LOAD SENSING APPARATUS AND METHOD

TECHNICAL FIELD

The present invention relates to an apparatus and method for sensing a load and, more particularly, to an apparatus and method for deriving an indication of an electrically isolated load.

BACKGROUND OF THE INVENTION

Isolation amplifiers are commonly used for providing electric power to electrical equipment while isolating the electrical equipment from direct connection to a power source. Typically, an oscillating electrical signal is inductively coupled to electrical equipment, such as through a transformer, to provide electrical energy to the electrical equipment. A feedback connection may be provided from the electrical equipment to the power source to control the amount of electrical energy being provided through the transformer.

For example, U.S. Pat. No. 4,667,144 to Jones et al. discloses a high frequency, high voltage MOSFET isolation amplifier in which variations in the input signal are corrected by providing feedback through a magnetic yoke load circuit.

U.S. Pat. No. 5,187,446 to Daly discloses a feedback isolation amplifier that also employs a separate isolation amplifier as part of a feedback circuit to compensate for variations in the input and output signals.

U.S. Pat. No. 3,896,366 to Onogi discloses an isolation transformer having primary and secondary windings in which the current in each of the windings is controlled by a variable impedance element. The variable impedance element forms a current limiter under control of an input signal. This patent also discloses providing current or voltage feedback from isolated load equipment to an input of a differential amplifier at the primary winding to control the current conducted through the windings.

U.S. Pat. No. 4,506,230 to Ashley-Rollman discloses an isolation circuit formed of an isolation amplifier having a primary winding and a pair of secondary windings. One of secondary windings provides feedback to an operational amplifier on the primary side of the isolation amplifier circuit for compensation.

U.S. Pat. No. 4,541,040 to Allfather discloses a power conversion system in which an isolation transformer couples the output of a power amplifier to a load. An indication of the load is provided to the power amplifier through a separate feedback path.

SUMMARY OF THE INVENTION

The present invention is directed to a load sensing apparatus that includes a signal generator operative to provide a first oscillating signal to a first side of a coupling. The coupling also has a second side connected with an input load circuit and maintains electrical isolation between the signal generator and the input load circuit. The input load circuit receives a load signal having a value. A signal which varies as a function of the load signal is provided at the first side of the coupling.

Preferably, the coupling is a transformer through which information indicative of the value of the input load signal is transmitted to effect variations in electric current conducted through a primary winding of the transformer.

BRIEF DESCRIPTION OF THE DRAWINGS

The foregoing and other features and advantages of the present invention will become apparent to those skilled in the art to which the present invention relates upon reading the following description with reference to the accompanying drawings, wherein.

DESCRIPTION OF PREFERRED EMBODIMENTS

Figure 1:
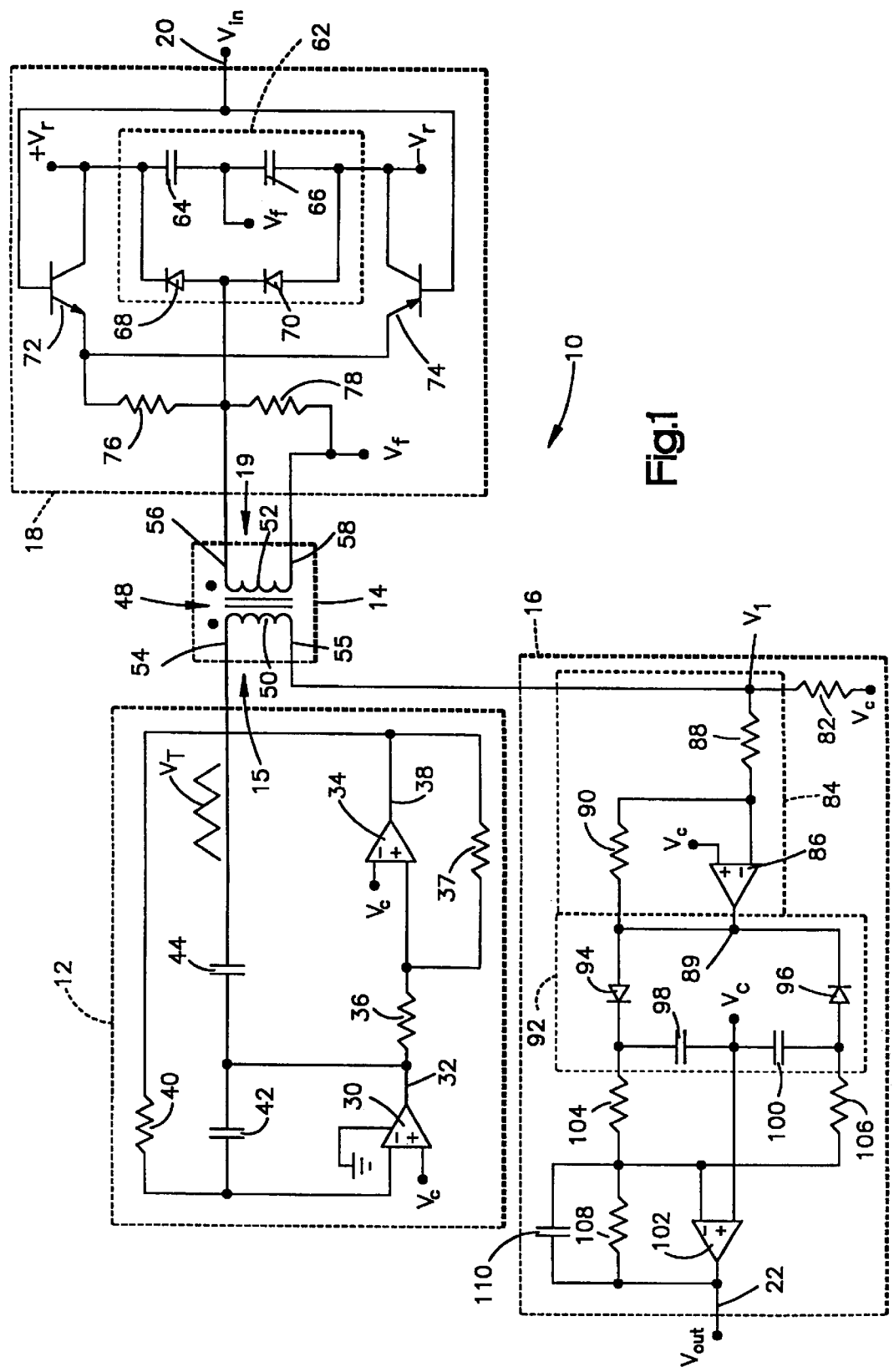
FIG. 1 is a schematic diagram of a load sensing system in accordance with a preferred embodiment of the present invention.

FIG. 1 illustrates a preferred embodiment of a sensing apparatus 10 in accordance with the present invention. In general, the apparatus 10 includes a signal generator 12 electrically connected with an isolation coupling 14. The signal generator 12 provides an oscillating input signal $V_T$ to a first side 15 of the isolation coupling 14. The signal $V_T$ has a substantially constant amplitude and duty cycle.

An output circuit 16 is electrically connected to the signal generator 12 through the first side 15 of the coupling 14. The output circuit 16 monitors a signal $V_1$ provided by the first side 15 of the coupling 14. The signal $V_1$ provided by the first side 15 of the coupling 14 varies as a function of the alternating input signal $V_T$ and as a function of an electrically isolated input load signal $V_{in}$.

An input load circuit 18 has an input 20 which is effective to receive the input load signal $V_{in}$. The input circuit 18 is connected to a second side 19 of the isolation coupling 14. The isolation coupling 14 maintains electrical isolation between the input circuit 18 and both the signal generator 12 and output circuit 16.

A signal proportional to the signal $V_T$ is induced at the second side 19 of the isolation coupling 14 to provide electrical power to the input circuit 18. The input circuit 18 derives information from the input load signal $V_{in}$ and provides such information to the second side 19 of the isolation coupling 14. The information is, in turn, transmitted through the coupling 14 from the second side 19 to the first side 15 to effect variations in the oscillating signal $V_T$ to provide the signal $V_1$ from the first side of the coupling.

The signal $V_1$ varies as a function of both the alternating input signal $V_T$ and the input load signal $V_{in}$. Because the amplitude and duty cycle of the signal $V_T$ from the signal generator 12 are substantially constant, variations in the signal $V_1$ provided by from the first side 15 of the coupling 14 to the output circuit 16 are proportional to the input signal $V_{in}$. Such variations are monitored by the output circuit 16.

In response to the variations in the signal $V_1$ from the first side 15 of the isolation coupling 14, the output circuit 16 provides an output signal $V_{out}$ at an output 22. The output signal $V_{out}$ has a value indicative of the value of the input load signal $V_{in}$. Accordingly, the system 10, in accordance with the present invention, derives an output signal $V_{out}$ indicative of the load signal $V_{in}$ while maintaining electrical isolation between the input circuit 18, which detects the load signal $V_{in}$, and both the signal generator 12 and the output circuit 16.

In the preferred embodiment of FIG. 1, the signal generator 12 is a triangle waveform generator which provides a triangle-shaped voltage waveform, indicated at $V_T$, to the input side 15 of the isolation coupling 14. The signal generator 12 includes a first op-amp 30 having a non-inverting input connected with a center voltage $V_c$ and an output 32 connected through a resistor 36 with a non-inverting input of a second op-amp 34. The inverting input of the op-amp 34 also is connected with the center voltage $V_c$. A feedback resistor 37 is connected between an output 38 of the second op-amp and its non-inverting input. Accordingly, the second op-amp 34 operates as a comparator with hysteresis. The output 38 of the second op-amp 34 is connected with the inverting input of op-amp 30 through a resistor 40 to provide an output signal which exhibits hysteresis relative to the center voltage $V_c$.

A capacitor 42 is connected between the inverting input and the output of the first op-amp 30. The output 32 of the first op-amp 30 provides a triangle waveform centered about the center voltage $V_c$. The triangle waveform at the output 32 is AC coupled to the input side 15 of the isolation coupling 14 through a capacitor 44. The capacitor 44 ensures that substantially no DC current is applied to the input side 15 of the isolation coupling 14.

Figure 2:
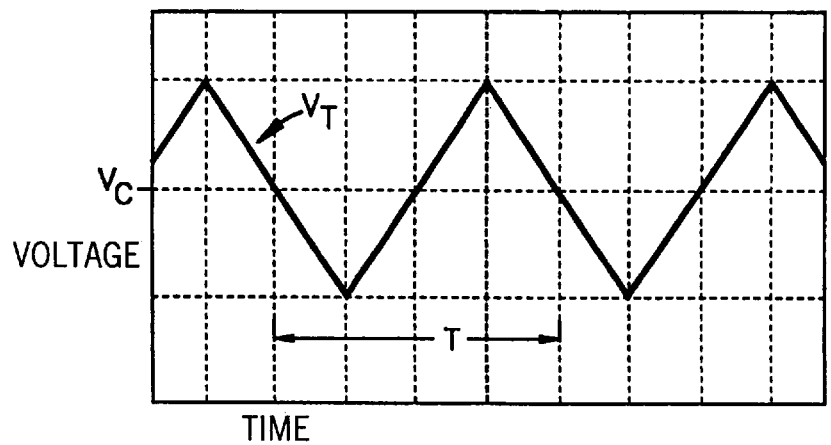
FIG. 2 is a graph illustrating an input signal waveform.

As shown in FIG. 2, the triangle voltage $V_T$ provided to the input side 15 of the coupling 14 preferably has constant, symmetric peak voltages relative to the center voltage $V_c$ and has a constant duty cycle. Because the triangle waveform at the output 32 of op-amp 30 is AC coupled through the capacitor 44 to the isolation coupling, there is no direct current component in the triangle waveform. As a result, the graphical area of the waveform $V_T$ over a complete cycle, indicated at T, must add to zero.

Various other types and configurations of signal generator circuits may be used to provide an acceptable oscillating input signal. As an alternative to the desired triangle waveform provided by the signal generator 12, other types of oscillating signals alternatively may be provided to the coupling 14, such as sine waves and saw-toothed waves. A triangle waveform advantageously provides easily detectable peak voltages.

The isolation coupling 14 preferably is a transformer 48 having a primary winding 50 and a secondary winding 52. The triangle waveform $V_T$ (FIG. 2) is provided by the signal generator 12 to a first end 54 of the primary winding 50. The current flow through the primary winding 50 induces an electromagnetic field through the core material of the transformer 48. The electromagnetic field in the core material, in turn, induces a corresponding output signal across ends 56 and 58 of the secondary winding 52 proportional to the turn ratio of the primary and second windings 50 and 52, respectively.

The transformer 48, for example, has a turn ratio of 1:1, although other turn ratios may also be used so long as the transformer is connected to provide the desired high degree of electric isolation between the circuitry connected to the primary winding 50, e.g. the signal generator 12 and the output circuit 16, and the input load circuit 18. A suitable example of an isolation transformer is Model No. LM301-1, which is commercially available from Datatronics.

The specific core material or configuration of the transformer 48 may determine which parameter or parameters of the waveform $V_1$ provide accurate indication of the load signal $V_{in}$. This is because different core materials may reflect information through the transformer 48 differently at different temperatures. It is desirable to provide consistent and accurate measurements of the input voltage signal $V_{in}$ over a wide range of temperatures.

The windings 50 and 52 of the transformer 48 are shown to have a voltage-current relationship according to the dotted ends or terminals 54 and 56 of the respective primary and secondary windings 50 and 52. A positive current into dotted end 54 induces, by mutual inductance, a positive current at dotted end 56 of the secondary winding 52. In this way, the triangle waveform $V_T$ provided at end 54 of the primary winding 50 results in a corresponding oscillating signal across the secondary winding 52.

The signal induced at the secondary winding 52 in response to the triangle waveform $V_T$ from the signal generator 12 is provided to the input circuit 18. Preferably, the input circuit 18 includes a voltage doubler circuit 62 of known configuration. Specifically, the voltage doubler circuit 62 is formed of two series connected capacitors 64 and 66 connected in parallel with diodes 68 and 70. The node between capacitors 64 and 66 is connected to a reference potential, indicated at $V_f$.

The reference potential $V_f$ may be any desired DC voltage, preferably at an electrical ground potential at zero volts, which is electrically isolated from both the signal generator 12 and the output circuit 16. The transformer 48 electrically isolates the reference potential $V_f$ from the center voltage $V_c$ and from the electric ground potential on the primary side of the transformer 48.

The node between diode 68 and capacitor 64 is connected to a first reference voltage indicated at $+V_r$ and the node between capacitor 66 and the anode of diode 70 is connected to a second voltage potential which is less than $+V_r$, namely $-V_r$. The isolated reference potential $V_f$ is selected to be midway between $+V_r$ and $-V_r$, e.g., at zero volts. The voltage potentials $+V_r$ and $-V_r$ are electrically isolated from the voltage source(s) and the electrical ground potential of the signal generator circuit 12 and the output circuit 16.

Each capacitor 64 and 66 of the input circuit 18 is loaded by an emitter follower configured transistor 72 and 74, respectively. Specifically, the bases of the transistors 72 and 74 are commonly connected to the input load signal $V_{in}$ by the input 20. The transistor 72 preferably is an NPN BJT transistor having its collector connected at the junction between the cathode of the diode 68 and the capacitor 64, which is also connected to $+V_r$.

The emitter of transistor 72 is electrically connected to the emitter of the transistor 74, which preferably is a PNP BJT transistor. The emitters of both transistors 72 and 74 also are connected through a resistor 76 to the end 56 of the secondary winding 52. The collector of the transistor 74 is connected to the node located between the capacitor 66 and the anode of diode 70, which also is connected to $-V_r$. Another resistor 78 is connected between ends 56 and 58 to help reduce ringing due to harmonics of the input circuit 18 and the transformer 48.

The amount of current conducted through the secondary winding 52 varies as a function of both the triangle wave $V_T$ provided to the primary winding 50 and the input signal $V_{in}$ relative to the reference potential $V_f$. Because the triangle waveform $V_T$ provided to the primary winding 50 by the signal generator 12 is held constant (FIG. 2), variations in the value of the input signal $V_{in}$ relative to the reference potential $V_f$ effect corresponding variations in the current conducted through the secondary winding 52.

When $V_{in}=V_f$, for example, the transistors 72 and 74 conduct equal amounts of current over time. This results in equal amounts of current being drawn by the input circuit 18 during both the positive and negative half cycles of $V_T$. Consequently, the current conducted through the secondary winding 52 remains symmetric over each cycle of the triangle voltage $V_T$. The current conducted through the primary winding 50, as detected by the output circuit 16 at $V_1$, also remains symmetric (FIG. 3), thereby indicating a measurement for input signal $V_{in}$ when $V_{in}=V_f$.

When $V_{in}$ is greater than the reference potential $V_f$, the transistor 72 conducts more current than transistor 74 over each cycle of the triangle voltage $V_T$. This results in the capacitor 64 discharging through transistor 72 more than capacitor 66 discharges through transistor 74. In order to maintain the relative voltage at the juncture between the capacitor 64 and the transistor 72 at the reference voltage $+V_r$, the diode 68 is forward biased to draw additional current from the secondary winding 52 to the capacitor 64 during the positive half cycle of $V_T$. This results in a corresponding increase in the positive peak current conducted through the secondary winding 52.

On the other hand, when $V_{in}$ is less than the reference voltage $V_f$, the transistor 74 conducts more current than transistor 72 over a cycle of the triangle voltage $V_T$. This results in the capacitor 66 discharging through transistor 74 more than capacitor 64 discharges through transistor 72. Accordingly, positive current flows from the end 56 of the secondary winding 52 through the transistor 74 to the capacitor 66, thereby increasing its charge to a positive level above the reference voltage $-V_r$. In order to maintain the relative voltage at the juncture between the capacitor 66 and the transistor 74 at $-V_r$, the diode 70 is forward biased to discharge, or provide negative current to the capacitor 66 through the diode 70 during the negative half cycle of $V_T$. This results in an increase in the negative peak current conducted through secondary winding 52.

The relative peaks in current conducted through the secondary winding 52 during each half cycle of $V_T$, thus, increase and decrease as a function of the input load signal $V_{in}$. These variations in the current conducted through the secondary winding 52 are transmitted, or reflected, through the transformer 48 from the secondary winding 52 to the primary winding 50. Such variations are superimposed onto the signal $V_T$ from the signal generator 12 to provide the signal $V_1$ which is monitored by the output circuit 16. The variations in the relative peak current conducted through the primary winding 50 during each half cycle of $V_T$ are proportional to the input load signal $V_{in}$.

The output circuit 16 is formed of detection circuitry that monitors the current waveform conducted through the primary winding 50, preferably including its duty cycle and/or its relative peak current levels. In the preferred embodiment of FIG. 1, the current through the primary winding 50 is detected as the voltage $V_1$ through a current sense resistor 82. The resistor 82 preferably is a low value resistor, such as, for example, about 100 ohms, connected between end 55 of the primary winding 50 and the center voltage $V_c$. Accordingly, the voltage $V_1$ across the resistor 82 is centered about the center voltage $V_c$ and varies as a function of the input load signal $V_{in}$.

Figure 3:
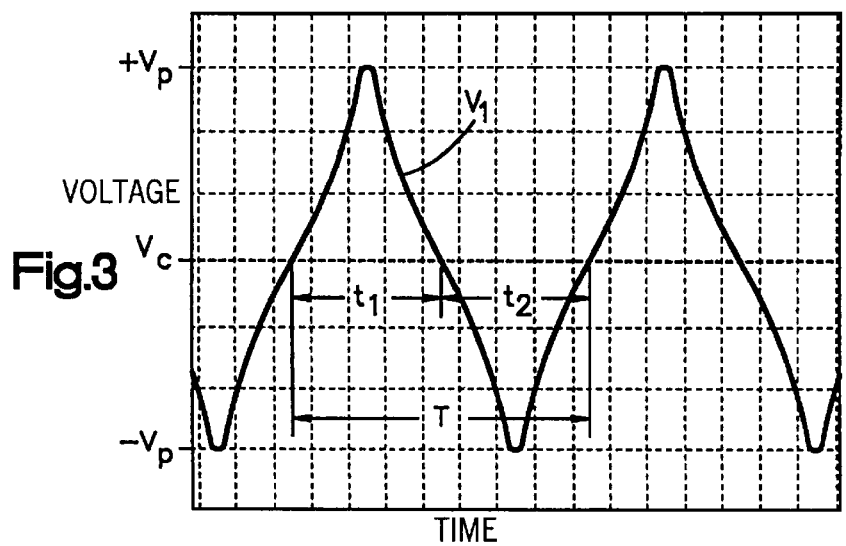
FIGS. 3 through 5 are graphs illustrating output waveforms for different conditions of the circuit of FIG. 1.

FIG. 3 is a graph illustrating the voltage signal $V_1$ across the resistor 82 when the input load voltage $V_{in}$ is equal to the reference potential $V_f$ ($V_{in}=V_f$). In this situation, the voltage waveform $V_1$ is symmetrical about the center voltage $V_c$. As with the triangle waveform $V_T$ of FIG. 2, the area under the waveform curve $V_1$ for a complete cycle, indicated at T, is zero.

Referring back to FIG. 1, when $V_{in}=V_f$, the transistors 72 and 74 conduct equal amounts of current over time. This results in the peak voltages $+V_p$ and $-V_p$ (FIG. 3) having equal magnitudes. In addition, each half cycle, e.g., the amount of time above and below the center voltage $V_c$, indicated respectively at $t_1$ and $t_2$, is of equal duration.

Figure 4:
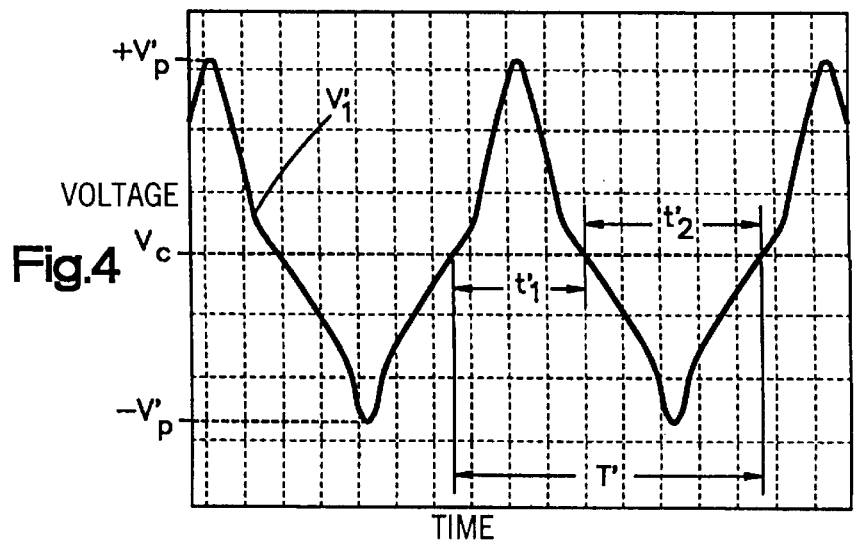

FIG. 4 illustrates the voltage across the resistor 82, indicated at $V_1'$, for a situation when $V_{in}$ is greater than the voltage reference $V_f$. In this situation, the peak voltages $+V_p'$ and $-V_p'$ of the waveform $V_1'$ are shifted upwards with respect to center voltage $V_c$. This shifting of the waveform $V_1'$ also reduces the duration of the positive half cycle, indicated at $t_1'$. The negative half cycle, indicated at $t_2'$, similarly is increased. The increase in the positive peak voltage $+V_p$ and the decrease in the time above $V_c$ for the positive half cycle vary inversely. The decrease in the negative peak voltage $-V_p'$ and the increase in the duration of the negative half cycle $t_2'$ also vary inversely. Even with the variations in peak voltages $+V_p'$ and $-V_p'$ and duration of each half cycle $t_1'$ and $t_2'$, the total graphical area under the voltage waveform curve $V_1$ remains zero over each complete cycle T'.

Figure 5:
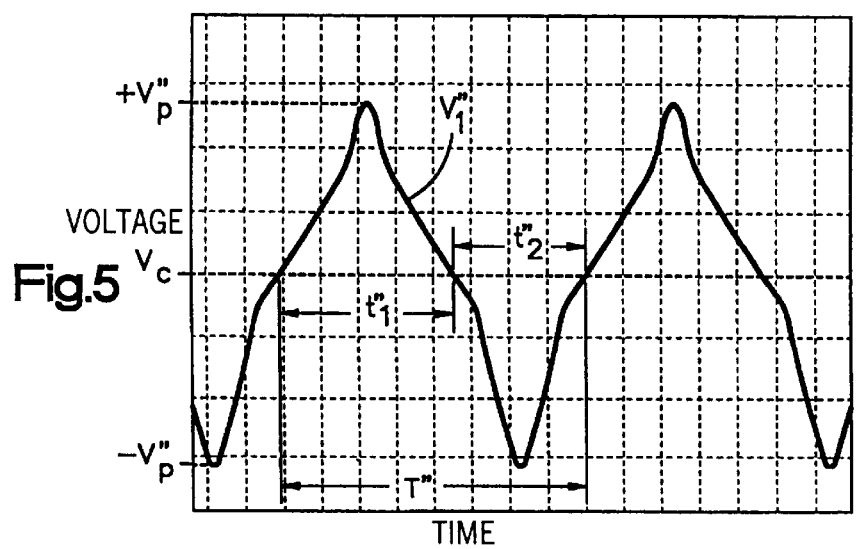

FIG. 5 illustrates the voltage waveform across the resistor 82, indicated at $V_1''$, for a situation when the input load signal $V_{in}$ is less than the reference voltage $V_f$ by the same amount that $V_{in}$ was greater than $V_f$ in FIG. 4. In this situation, the peak voltages $+V_p''$ and $-V_p''$ of the waveform $V_1''$ are shifted downward with a corresponding change in the duty cycle. Specifically, the positive peak voltage $+V_p''$ is less than both $+V_p$ and $+V_p'$ of FIGS. 3 and 4, respectively. The time above $V_c$ for the positive half cycle $t_1''$ is increased and substantially equal to $t_2'$ of FIG. 4.

The shifts in the waveforms $V_1'$ and $V_1''$ of FIGS. 4 and 5 are essentially equal and opposite because $V_{in}$ has been decreased below $V_f$ for the situation of FIG. 5 by an amount equal to the amount of $V_{in}$ was increased above $V_f$ for the situation of FIG. 4. Consequently, the duration of the negative half cycle $t_2''$ (FIG. 5) is substantially equal to the duration of the positive half cycle $t_1'$ (FIG. 4). As in each of the situations of FIGS. 3 and 4, the graphical area under the voltage waveform curve $V_1''$ of FIG. 5 is equal to zero over each complete cycle T''.

Referring back to the preferred embodiment of the output circuit shown in FIG. 1, the voltage $V_1$ is amplified by an inverting amplifier circuit 84. In particular, the voltage $V_1$ is provided to an inverting input of an op-amp 86 through a gain set resistor 88. The value of the resistor 88 is selected to amplify the voltage signal $V_1$ to a useable level. The non-inverting input of op-amp 86 is connected to the center voltage $V_c$. The inverting input of the op-amp 86 is connected by a feedback resistor 90 to an output 89 of the op-amp 86.

The output 89 is connected to a voltage doubler circuit 92, which is similar to the voltage doubler circuit 62 of the input load circuit 18. Specifically, the output 89 of op-amp 86 provides an output to a node connected between a pair of diodes 94 and 96. A pair of capacitors 98 and 100 are connected between the cathode of diode 94 and the anode of diode 96. The node between capacitors 98 and 100 is connected to the center voltage $V_c$, which is provided to the non-inverting input of another op-amp 102.

The capacitors 98 and 100 are connected through respective resistors 104 and 106 to an inverting input of the op-amp 102. The op-amp 86 provides an inverted, amplified signal indicative of the voltage signal $V_1$ at its output 89 which, in turn, biases the diodes 94 and 96. The diodes 94 and 96 are biased so as to alternately charge and discharge the capacitors 98 and 100 through the resistors 104 and 106, respectively, as a function of the voltage signal $V_1$.

The op-amp 102 operates as a summing circuit with its inverting input connected to each capacitor through the resistors 104 and 106. Its non-inverting input is connected to $V_c$. An RC filter is formed of a resistor 108 and a capacitor 110 is connected across the output of op-amp 102 and the inverting input thereof to provide filtering through integration. The op-amp 102 performs a summing operation on the signals provided by the charging and discharging of capacitors 98 and 100 relative to the center voltage $V_c$. The output 22 of the op-amp 102 provides the output signal $V_{out}$ which has a value proportional to the input voltage $V_{in}$.

The particular embodiment of the output circuit 16 illustrated in FIG. 1 operates as a peak detector that provides the output signal $V_{out}$ based on the peak voltages across the resistor 82. For example, when the waveform $V_1$ is balanced, such as when $V_{in}=V_p$, the capacitors 98 and 100 charge and discharge equally and by opposite amounts, thereby canceling at the summing junction of op-amp 102. This results in $V_{out}$ being zero. When the waveform $V_1$ is asymmetric about $V_c$, such as when $V_{on} \neq V_p$, the capacitors 98 and 99 charge and discharge by different amounts, which, when summed by op-amp 102 relative to $V_c$, result in a corresponding increase or decrease in the value of $V_{out}$.

While the preferred embodiment of output circuit 16 illustrated in FIG. 1 derives the output signal $V_{out}$ from the peak voltages, either the peak voltages or duty cycle, or both peak voltages and duty cycle, could be used to derive the output signal $V_{out}$. Various configurations of alternative suitable peak detectors and duty cycle detectors are known in the art. Other parameters of the current waveform through the primary side 50 of the transformer 48 also could monitored, in accordance with the present invention, to provide an indication of the input load signal $V_{in}$.

Figure 6:
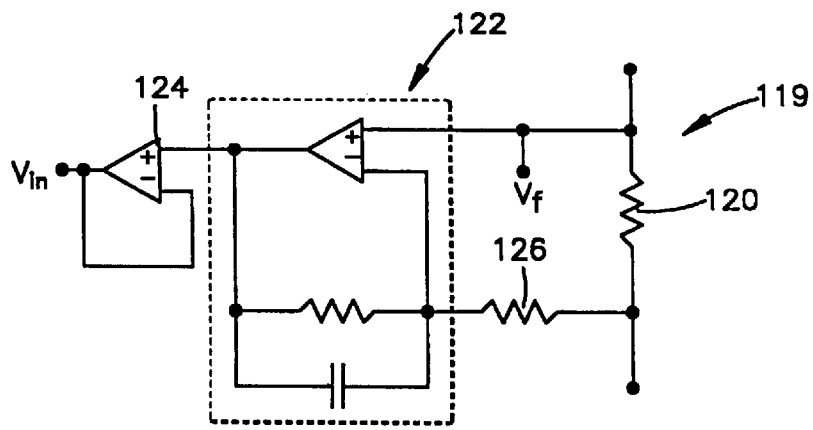
FIG. 6 is an example of a circuit for providing a signal to the circuit of FIG. 1.
Figure 7:
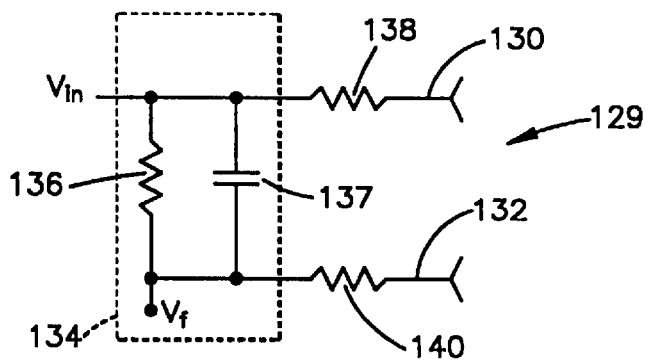
FIG. 7 is an example of another circuit for providing a signal to the circuit of FIG. 1.

FIGS. 6 and 7 are examples of suitable circuits that may be used to provide the input signal $V_{in}$ at the input 20. Although, two examples are shown to derive a suitable input signal, the particular circuitry is matter of design choice. Any appropriate circuit may be used, in accordance with the present invention, to effect detectable variations in the current through the secondary winding of the transformer.

FIG. 6 illustrates a shunt sensing circuit 119 in which current is measured across a current sense resistor 120. The voltage across the current sense resistor 120 is filtered and boosted to a useable voltage level through amplifier circuits 122 and 124. The gain of the amplifier circuit 122 may be set to a desired level by selection of an appropriate gain adjust resistor 126. The output of amplifier 124 corresponds to the input signal $V_{in}$. The current conducted through the current sense resistor 120 may be used to measure virtually any electrical current quantity. The circuit 119 of FIG. 6 conveniently converts the current to a useable voltage level for use in the input load circuit 18.

FIG. 7 illustrates a voltage sensing circuit 129 that provides an output corresponding to the input load signal $V_{in}$. Specifically, a pair of terminals 130 and 132 may be connected to measure a desired voltage potential to be monitored. Depending on the level of the voltage being measured, suitable amplifier circuits may be used to adjust the detected voltage signal to a useable level. The terminals 130 and 132 are connected to opposed ends of an RC filter network 134, which is formed of a resistor 136 and a capacitor 137 connected in parallel between resistors 138 and 140. Resistors 138 and 140 preferably are of equal value and substantially larger than the resistor 136 of the RC network 134. The voltage potential across terminals 130 and 132 is stabilized by the RC network to provide the input signal $V_{in}$. Various types of other circuit configurations may be used to sense various parameters for use with the apparatus 10 in accordance with the present invention.

From the above description of the invention, those skilled in the art will perceive improvements, changes and modifications. Such improvements, changes and modifications within the skill of the art are intended to be covered by the appended claims.

Having described the invention, the following is claimed:

1. A load sensing apparatus comprising:

a signal generator operative to provide a first oscillating signal;

an input circuit having an input effective to receive a load signal having a value;

a coupling having a first side connected with said signal generator for receiving the first oscillating signal, said coupling having a second side connected with said input circuit for receiving a second oscillating signal functionally related to the first oscillating signal, said coupling maintaining electrical isolation between said signal generator and said input circuit, the first side of said coupling providing a third oscillating signal which varies as a function of the value of the load signal and the first oscillating signal;

an output circuit electrically connected with the first side of said coupling and responsive to the third oscillating signal, said output circuit being operative to provide an output signal having a value indicative of the value of the load signal in response to the third oscillating signal;

wherein said coupling is a transformer having a primary winding electrically connected between said signal generator and said output circuit, the first oscillating signal being provided to a first end of said primary winding, said transformer having a secondary winding electrically connected with said input circuit, the second oscillating signal being provided at said secondary winding, the third oscillating signal being provided at a second end of said primary winding and varying as a function of the value of the load signal and the first oscillating signal.

2. An apparatus as set forth in claim 1 wherein information indicative of the value of the load signal is transmitted through said coupling to effect variations in the first oscillating signal to provide the third oscillating which has a value proportional to the value of the load signal.

3. An apparatus as set forth in claim 1 wherein the third oscillating is an electric current signal conducted through said primary winding.

4. An apparatus as set forth in claim 3 wherein the electric current signal conducted through said primary defines an oscillating waveform having a duty cycle and alternating relative peaks, the duty cycle and alternating peaks of the oscillating waveform varying as a function of the value of the load signal, said output circuit providing the output signal based on at least one of the duty cycle and peak voltage of the oscillating waveform.

5. An apparatus as set forth in claim 1 wherein the load signal is in the form of a variable input voltage having a value relative to a reference voltage potential, said input circuit effecting variations in the second oscillating signal as a function of the value of the variable input voltage relative to the reference voltage potential, the variations in the second oscillating signal being transmitted through said coupling to effect corresponding variations in the first oscillating signal to provide the third oscillating signal.

6. An apparatus as set forth in claim 1 wherein the third oscillating signal includes at least one parameter responsive to the value of the load signal, the at least one parameter of the third oscillating signal including a peak current level relative to a current level of the first oscillating signal, the peak current level of the third oscillating signal having a value proportional to the value of the load signal.

7. An apparatus as set forth in claim 1 wherein the third oscillating signal defines an oscillating waveform having a duty cycle and alternating relative peaks, the duty cycle and peaks of the oscillating waveform varying as a function of the value of the load signal in response to information indicative of the value of the load signal being transmitted through said coupling.

8. An apparatus as set forth in claim 7 wherein the duty cycle and peaks vary in an inverse relationship as a function of the value of the load signal.

9. A load sensing apparatus comprising:
   a signal generator which is effective to provide an oscillating input signal;
   an input circuit effective to receive an input signal having a value relative to a reference value;
   a primary winding having first and second ends, the first end of said primary winding being connected with said signal generator for receiving the first oscillating input signal and conducting corresponding electric current through said primary winding; and
   a secondary winding inductively coupled with said primary winding and connected with said input circuit so as to provide electrical isolation between said signal generator and said input circuit, the input signal effecting variations in the electric current conducted through said secondary winding which are transmitted from said secondary winding to said primary winding to effect corresponding variations in the electric current conducted through said primary winding proportional to the value of the load signal.

10. An apparatus as set forth in claim 9 further including output circuitry electrically connected with the second end of said primary winding, said output circuitry being effective to provide an output signal indicative of the value of the load signal, the output signal varying as a function of the electric current conducted through said primary winding.

11. An apparatus as set forth in claim 10 wherein the electric current conducted through said primary winding defines an oscillating waveform having a duty cycle and alternating relative peaks, the duty cycle and alternating peaks varying as a function of the value of the input signal, said output circuitry providing the output signal as a function of at least one of the duty cycle and peaks of the oscillating waveform.

12. A method for sensing an electrically isolated load signal, said method comprising the steps of:
   providing a first oscillating signal to a first side of an inductive coupling;
   inductively coupling the input signal from the first side of the inductive coupling to a second side of the inductive coupling so as to maintain electrical isolation between the first and second sides of the inductive coupling;
   in response to said step of providing the first oscillating signal, providing a second oscillating signal at the second side of the inductive coupling as a function of the first oscillating signal;
   applying a load signal at the second side of the inductive coupling, the load signal having a value relative to a reference signal;
   transmitting information indicative of the value of the load signal through the inductive coupling from the second side of the inductive coupling to the first side of the inductive coupling; and
   in response to said step of transmitting, effecting variations in the first oscillating signal to provide a third oscillating signal at the first side of the inductive coupling proportional to the value of the load signal.

13. A method as set forth in claim 12 further including the step of quantifying the variations in the first oscillating signal and, in response to said step of quantifying, providing an output signal having a value proportional to the value of the load signal.

14. A method as set forth in claim 13 wherein said step of quantifying further includes determining the value of the output signal as a function of at least one of a peak current and a duty cycle of the third oscillating signal, the duty cycle and the peak current of the third oscillating signal varying as a function the value of the load signal.

15. A method as set forth in claim 12 wherein said step of applying the load signal further includes the steps of applying a load signal having a value relative to a reference value, and effecting variations in the second oscillating signal at the second side of the inductive coupling in response to the load signal, the variations in the second oscillating signal being transmitted through the inductive coupling to, in turn, effect variations in the first oscillating signal to provide the third oscillating signal at the first side of the inductive coupling.

16. A method as set forth in claim 12 wherein the inductive coupling is an isolating transformer having primary and secondary windings, said method further including the steps of providing the first oscillating signal to one end of the primary winding which results in the second oscillating signal being provided at the secondary winding, effecting variations in the second oscillating signal in response to said step of applying the load signal, said step of transmitting further including transmitting variations in the second oscillating signal from the secondary winding to the primary winding to effect variations in the amount of electrical current conducted through the primary winding proportional to the value of the load signal.

* * * * *